United States Patent
Selsley et al.

(10) Patent No.: US 8,227,344 B2
(45) Date of Patent: Jul. 24, 2012

(54) HYBRID IN-SITU DRY CLEANING OF OXIDIZED SURFACE LAYERS

(75) Inventors: Adam Selsley, Schenectady, NY (US); Frank M. Cerio, Jr., Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 12/714,152

(22) Filed: Feb. 26, 2010

(65) Prior Publication Data

US 2011/0212274 A1    Sep. 1, 2011

(51) Int. Cl.
*H01L 21/44* (2006.01)
(52) U.S. Cl. ....................................... 438/677
(58) Field of Classification Search .................. 438/677
See application file for complete search history.

(56) References Cited

U.S. PATENT DOCUMENTS

| | | | | |
|---|---|---|---|---|
| 5,403,434 A | * | 4/1995 | Moslehi | 134/1.2 |
| 6,905,965 B2 | * | 6/2005 | Subrahmanyan et al. | 438/687 |
| 7,169,704 B2 | * | 1/2007 | Koo et al. | 438/677 |
| 7,611,990 B2 | * | 11/2009 | Yoon et al. | 438/680 |
| 2004/0242012 A1 | | 12/2004 | Ikeda | |

\* cited by examiner

*Primary Examiner* — Charles Garber
*Assistant Examiner* — Andre' C Stevenson

(57) ABSTRACT

According to one embodiment, the method includes providing a substrate containing a metal-containing barrier layer having an oxidized surface layer, exposing the oxidized surface layer to a flow of a first process gas containing plasma-excited argon gas to activate the oxidized surface layer and applying substrate bias power during the exposing of the oxidized surface layer to the flow of the first process gas. The method further includes exposing the activated oxidized surface layer to a second process gas containing non-plasma-excited hydrogen gas, wherein the exposure to the first process gas, in addition to activating the oxidized surface layer, facilitates chemical reduction of the activated oxidized surface layer by the second process gas containing the hydrogen gas. A thickness of the metal-containing barrier layer is not substantially changed by the hybrid in-situ dry cleaning process.

20 Claims, 10 Drawing Sheets

US 8,227,344 B2

HYBRID IN-SITU DRY CLEANING OF OXIDIZED SURFACE LAYERS

FIELD OF INVENTION

The present invention relates to a method of dry cleaning oxidized surface layers, and more particularly to a method of in-situ dry cleaning of oxidized barrier layers used in metallization of integrated circuits.

BACKGROUND OF THE INVENTION

The introduction of copper (Cu) metal into multilayer metallization schemes for manufacturing integrated circuits necessitates the use of barrier layers to promote adhesion and growth of the Cu layers and to prevent diffusion of Cu into dielectric materials, for example low dielectric constant (low-k) dielectric materials with k values below that of $SiO_2$ (k~3.9). Barrier layers that are deposited onto dielectric materials can include refractive materials, such as tungsten (W), molybdenum (Mo), and tantalum (Ta), and compounds thereof. These materials are non-reactive and immiscible in Cu, and can offer low electrical resistivity.

Cu integration schemes for technology nodes less than or equal to 130 nm can utilize a Ta-containing barrier layer, e.g., Ta, TaN, or a combination thereof. The presence of impurities in the Ta-containing barrier layer can result in poor adhesion between the Ta-containing barrier layer and adjacent materials, including Cu metal layers. The impurities can include reaction by-products from partially reacted Ta-precursors in the Ta-containing barrier layer, or oxidation of the Ta-containing barrier layer during deposition of the barrier layer, during transfer of the barrier layer between processing chambers, or during air exposure of the barrier layer in a manufacturing process flow. The poor adhesion between the Ta-containing barrier layer and adjacent materials can result in electro-migration (EM) and stress migration (SM) problems in the integrated circuit, as well as reduced device production yields.

Conventional plasma etching (cleaning) processes for removing impurities from substrates and barrier layers include processes that can cause plasma damage of the substrates and the barrier layers due to high kinetic energies of ions impinging on the substrate or the barrier layers. In many cases these plasma etching processes can cause at least partial removal of the diffusion barrier layers. As the minimum feature sizes of microelectronic devices in integrated circuits are approaching the deep sub-micron regime to meet the demand for faster, lower power microprocessors and digital circuits, the miniaturization necessitates the use of ultra-thin barrier layers, often with a thickness of only a few nanometers (nm). Therefore, even partial removal of a thickness of an ultra-thin diffusion barrier layer using common plasma etching processes is not acceptable.

Therefore, new dry cleaning processes are needed for cleaning of oxidized surface layers in integrated circuits, including cleaning of oxidized surface layers of ultra-thin barriers layers in advanced metallization schemes.

SUMMARY OF THE INVENTION

Methods for hybrid in-situ dry cleaning of oxidized surface layers from a substrate are disclosed in several embodiments. As used herein, the hybrid in-situ dry cleaning method refers to a process that activates an oxidized surface layer using a plasma process and, subsequently, chemically reduces the activated oxidized surface layer using a non-plasma process. According to one embodiment, an oxidized surface layer of a metal-containing barrier layer is chemically reduced, where a thickness of the metal-containing barrier layer is not substantially changed by the hybrid in-situ dry cleaning process.

According to one embodiment, the method includes providing a substrate containing a metal-containing barrier layer having an oxidized surface layer, exposing the oxidized surface layer to a flow of a first process gas containing plasma-excited argon (Ar) gas to activate the oxidized surface layer and applying substrate bias power during the exposing of the oxidized surface layer to the flow of the first process gas. The method further includes exposing the activated oxidized surface layer to a second process gas containing non-plasma-excited hydrogen gas, where the exposure to the first process gas, in addition to activating the oxidized surface layer, facilitates chemical reduction of the activated oxidized surface layer by the second process gas containing the hydrogen gas. A thickness of the metal-containing barrier layer is not substantially changed by the exposing and applying steps.

According to another embodiment, a method is provided for processing a substrate. The method includes providing the substrate in a vacuum processing tool, depositing a metal-containing barrier layer on the substrate in the vacuum processing tool, and performing a hybrid in-situ dry cleaning of an oxidized surface layer of the metal-containing barrier layer. The hybrid in-situ dry cleaning includes exposing the oxidized surface layer to a flow of a first process gas containing plasma-excited argon gas to activate the oxidized surface layer, applying substrate bias power during the exposing of the oxidized surface layer to the flow of the first process gas, and exposing the activated oxidized surface layer to a second process gas containing non-plasma-excited hydrogen gas, where the exposure to the first process gas, in addition to activating the oxidized surface layer, facilitates chemical reduction of the activated oxidized surface layer by the second process gas containing the hydrogen gas. A thickness of the metal-containing barrier layer is not substantially changed by the exposing and applying steps. The method still further includes following the performing, depositing a metal-containing film on the metal-containing barrier layer, wherein the hybrid in-situ dry cleaning and the depositing the metal-containing film on the metal-containing barrier layer are carried out without exposing the metal-containing barrier layer to air.

According to yet another embodiment, a method is provided for processing a substrate. The method includes providing the substrate in a first vacuum processing tool, depositing a metal-containing barrier layer on the substrate in the first vacuum processing tool, transferring in air the substrate containing the metal-containing barrier layer from the first vacuum processing tool to a second vacuum processing tool, and performing a hybrid in-situ dry cleaning of an oxidized surface of the metal-containing barrier layer in the second vacuum processing tool. The hybrid in-situ dry cleaning process includes exposing the oxidized surface layer to a flow of a first process gas containing plasma-excited argon gas to activate the oxidized surface layer, applying substrate bias power during the exposing of the oxidized surface layer to the flow of the first process gas, and exposing the activated oxidized surface layer to a second process gas containing non-plasma-excited hydrogen gas, wherein the exposure to the first process gas, in addition to activating the oxidized surface layer, facilitates chemical reduction of the activated oxidized surface layer by the second process gas containing the hydrogen gas. A thickness of the metal-containing barrier layer is not substantially changed by the exposing and applying steps. The method still further includes following the performing, depositing a metal-containing film on the metal-containing barrier layer in the second vacuum processing tool, wherein the hybrid in-situ dry cleaning and the depositing the metal-containing film on the metal-containing barrier layer are carried out without exposing the metal-containing barrier layer to air.

DETAILED DESCRIPTION OF THE DRAWINGS

In the accompanying drawings:

FIGS. 1A-1E schematically show a hybrid in-situ dry cleaning process in accordance with an embodiment of the invention;

Figure 11A:
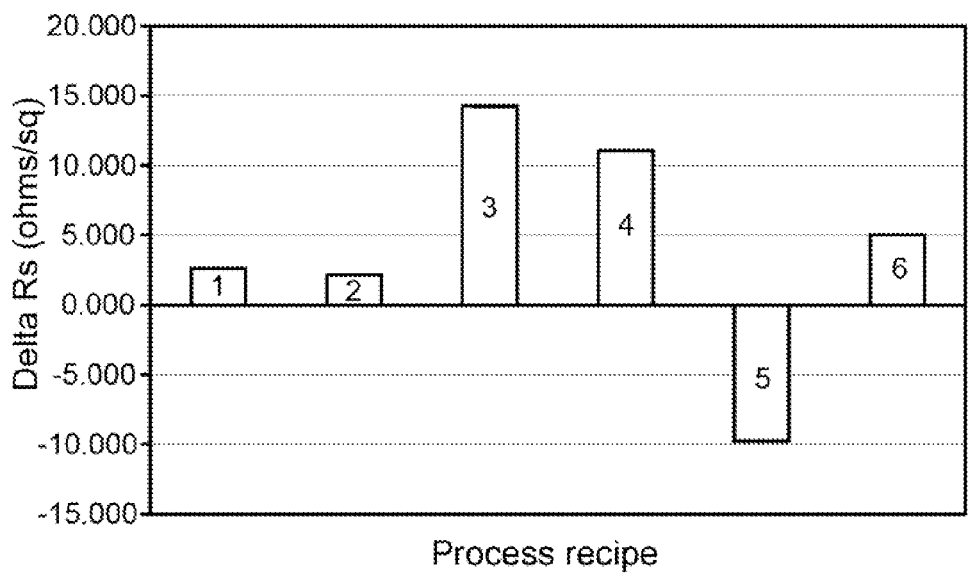
Figure 11B:
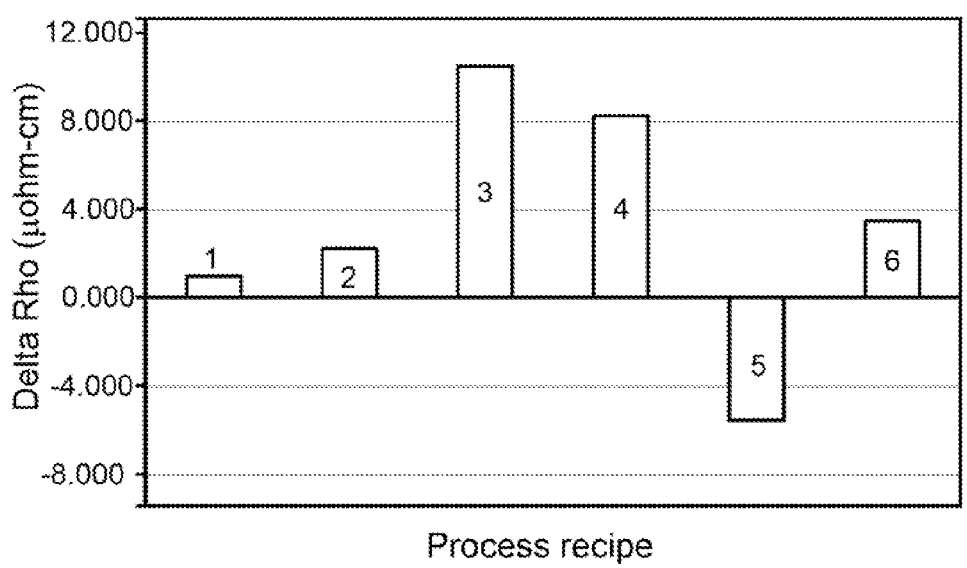
Figure 12A:
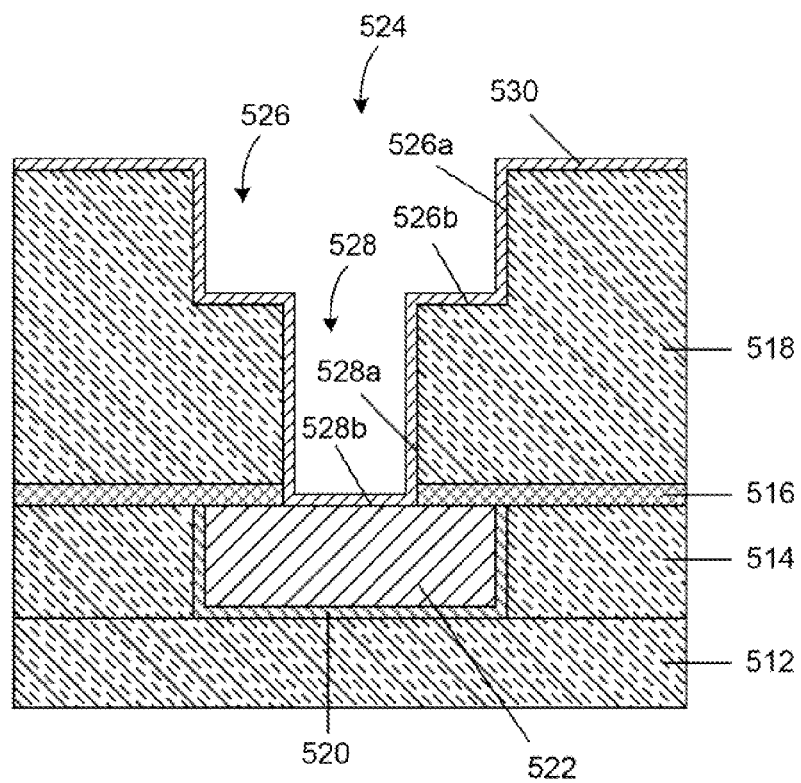
Figure 12B:
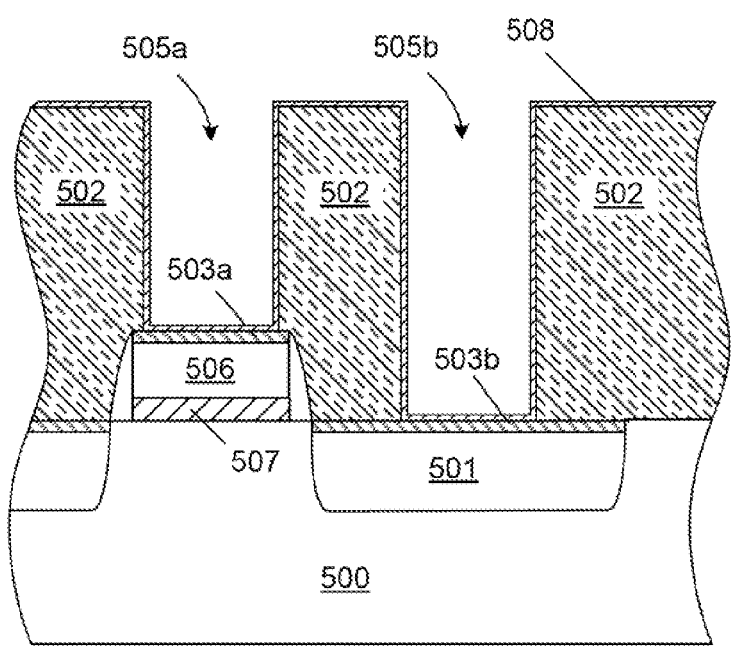

FIGS. 11A and 11B present process data for dry cleaning of oxidized surface layers according to an embodiment of the invention; and FIGS. 12A and 12B schematically show cross-sectional views of exemplary recessed features according to embodiments of the invention.

DETAILED DESCRIPTION OF SEVERAL EMBODIMENTS

Methods for hybrid in-situ dry cleaning of oxidized surface layers are disclosed in several embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. In this detailed description, like parts are designated by like reference numbers throughout the several drawings.

According to some embodiments of the invention, the oxidized surface layers can include surfaces of barrier layers that are commonly utilized as diffusion barriers in semiconductor devices. Surfaces of barrier layer materials may become oxidized during a manufacturing process due to high reactivity of the deposited barrier layer materials with oxygen-containing gases. The oxygen-containing gases can include background gases such as $O_2$ and $H_2O$ gases in a processing environment in the processing chambers (e.g., barrier layer deposition chambers), in transfer chambers that couple processing chambers under low gas pressure, and/or in air if the barrier layers are exposed to air in the manufacturing process flow. In some examples, air exposure may occur during transfer of substrates from a first vacuum processing tool containing a barrier layer deposition chamber, to a second vacuum processing tool containing a process chamber configured for depositing a seed layer or a liner on the barrier layer.

The presence of oxidized surface layers in film structures can cause poor adhesion between different materials, for example between oxidized barrier layers and Cu metal, or between oxidized barrier layers and any overlying metal-containing seed layers or liners that are deposited on the barrier layers prior to Cu metal deposition. The poor adhesion between the oxidized barrier layers and adjacent materials can result in electro-migration (EM) and stress migration (SM) problems in the semiconductor device, as well as reduced device production yields.

In one example, a semiconductor device can contain a patterned substrate having a recessed feature, a barrier layer formed on the bottom and on the sidewalls of the recessed feature, a metal or metal-containing film (e.g., ruthenium (Ru) metal, Ru compounds, cobalt (Co) metal, or Co compounds) formed on the barrier layer in the recessed feature, and bulk Cu metal filling the recessed feature. The presence of an oxidized surface layer on the barrier layer can affect initial stages of chemical vapor deposition (CVD) of Ru metal on the barrier layer where low Ru seed (nuclei) density is formed on the oxidized surface layer compared to on a non-oxidized (clean) surface of a barrier layer. The low Ru seed density on the oxidized surface layer can lead to deposition of a Ru metal film with high film roughness and can further result in increased electrical resistivity of the bulk Cu metal filling the recessed feature due to high levels of electron scattering, and poor adhesion between the oxidized barrier layer and the Ru metal film.

There is therefore a general need for new methods for removing or cleaning oxidation from barrier layers during a manufacturing process flow. Common cleaning processes for removing impurities and oxidation from substrates and barrier layers/liners include plasma cleaning processes that can cause plasma damage and result in at least partial removal of the barrier layers/liners. Since the barrier layers/liners are often ultra-thin, for example with a thickness between 1 nanometers (nm) and 10 nm, or a thickness between 2 nm and 5 nm, the cleaning methods should not reduce a thickness of the barrier layers/liners but instead chemically reduce the oxidized surfaces of the barrier layers prior to film deposition on the clean barrier layers surfaces.

FIGS. 1A-1E schematically show a hybrid in-situ dry cleaning process in accordance with an embodiment of the invention. Exemplary planar film structures are depicted and described in FIGS. 1A-1E, but embodiments of the invention may also be applied to simple and advanced types of recessed features found in integrated circuit design. FIGS. 12A and 12B schematically show cross-sectional views of recessed features according to additional embodiments of the invention. As will be appreciated by one of ordinary skill in the art, embodiments of the invention can be readily applied to the recessed features depicted in FIGS. 12A and 12B and other simple or advanced recessed features.

Figure 1A:
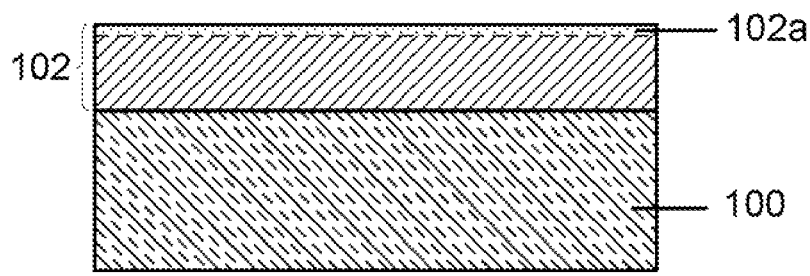

FIG. 1A shows a schematic cross-sectional view of a substrate 100 containing a metal-containing barrier layer 102 deposited or grown on the substrate 100. The substrate 100 may, for example, contain silicon (Si), germanium (Ge), silicon germanium (SiGe), a low-dielectric constant material (low-k), or a high-dielectric constant (high-k) material. In some embodiments of the invention, the metal-containing barrier layer 102 may contain a tantalum(Ta)-containing material, a titanium(Ti)-containing material, or a tungsten (W)-containing material, or a combination thereof. Examples of Ta-containing materials include Ta, TaN, TaCN, TaC, and combinations thereof. Examples of Ti-containing materials include Ti, TiN, TiCN, TiC, and combinations thereof. Examples of W-containing materials include W, WN, WCN, WC, and combinations thereof. Other metal-containing barrier layer materials are also contemplated and may be used.

According to some embodiments, the metal-containing barrier layer 102 may include a Ta-containing material that is suitable for Cu metallization. For example, Cu metal (not shown) may be deposited onto the metal-containing barrier layer 102, or a metal-containing liner (not shown) may be deposited onto the metal-containing barrier layer 102 and, thereafter, bulk Cu metal (not shown) deposited on the metal-containing liner. Examples of metal-containing liners include Ru metal, Ru oxides, Ru nitrides, Ru oxynitrides, Co metal, Co oxides, Co nitrides, Co oxynitrides, and combinations thereof.

Still referring now to FIG. 1A, post-deposition oxidation of the metal-containing barrier layer 102 can form an oxidized surface layer 102a. A thickness of the oxidized surface layer 102a can be about 1 nm or less, for example between about 0.4 nm and about 1 nm. In one example, the metal-containing barrier layer 102 can contain TaN and the oxidized surface layer 102a can contain TaON with Ta—O chemical bonds.

The oxidized surface layer 102a may form as a result of exposure of the metal-containing barrier layer 102 to oxygen-containing gases prior to deposition of further layers or films on the metal-containing barrier layer 102. The oxygen-containing gases may be present in the processing environment in a barrier layer deposition chamber and/or in one or more transfer chambers that couple the barrier layer deposition chamber to other processing chambers under sub-atmospheric pressure conditions (e.g., about 100 mTorr of Ar purge gas). Furthermore, the substrate 100 containing the metal-containing barrier layer 102 may be exposed to $O_2$ gas and $H_2O$ gas in air if the process flow includes transferring the substrate 100 containing the metal-containing barrier layer 102 in air between vacuum processing tools.

According to embodiments of the invention, the oxidized surface layer 102a is chemically reduced in a hybrid in-situ dry cleaning process to at least substantially remove the oxidation and regenerate a clean surface of the metal-containing barrier layer 102 prior to depositing additional films or layers on the metal-containing barrier layer 102. The hybrid in-situ dry cleaning process provides a clean metal-containing barrier layer 102 with the enhanced chemical bonding needed for improving the properties and integration of diffusion barriers/liners into Cu metallization schemes. In one example, it is contemplated that the hybrid in-situ dry cleaning process may further form a "metal-rich" (e.g., Ta-rich) surface with strong bonding to other materials by removing nitrogen from a metal nitride barrier layer (e.g., TaN).

Figure 1B:
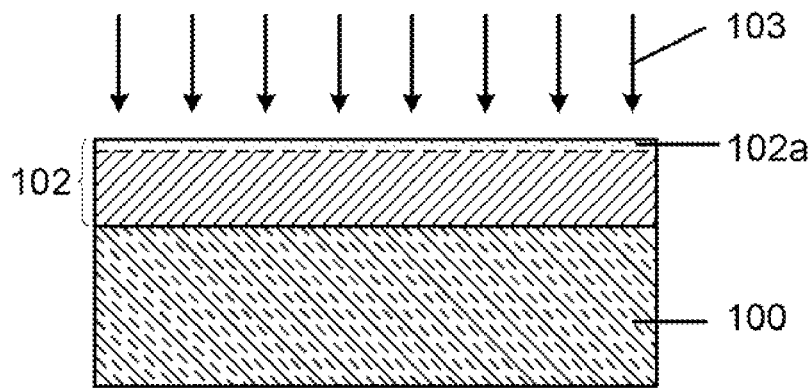

Referring now to FIG. 1B, the substrate 100 is provided on a substrate holder in a plasma processing chamber. A first process gas containing argon gas is flowed into the plasma processing chamber, a first gas pressure in selected in the plasma processing chamber, a plasma is generated from the first process gas in the plasma processing chamber, and a non-zero substrate bias power is applied to the substrate 100. The oxidized surface layer 102a is exposed to plasma-excited argon gas 103 in the plasma to activate the oxidized surface layer 102a for a subsequent chemical reduction process. According to embodiments of the invention, the kinetic energy of argon ions in the plasma-excited argon gas 103 impinging on the oxidized surface layer 102a may be controlled by the substrate bias power. The substrate bias power is below a threshold bias level that results in sputtering of metal species (e.g., Ta) from the oxidized surface layer 102a. Therefore, at least substantially no metal species of the metal-containing barrier layer 102 are removed by the plasma-excited argon gas 103. The inventors believe that the activation of the oxidized surface layer 102a includes disrupting or weakening of metal-oxygen bonds in the oxidized surface layer 102a by the interaction of the argon ions with the oxidized surface layer 102a. The presence of disrupted or weakened metal-oxygen bonds enables subsequent chemical reduction of an activated oxidized surface layer 102b depicted in FIG. 1C by a second process gas containing non-plasma-excited hydrogen ($H_2$) gas.

Figure 1C:
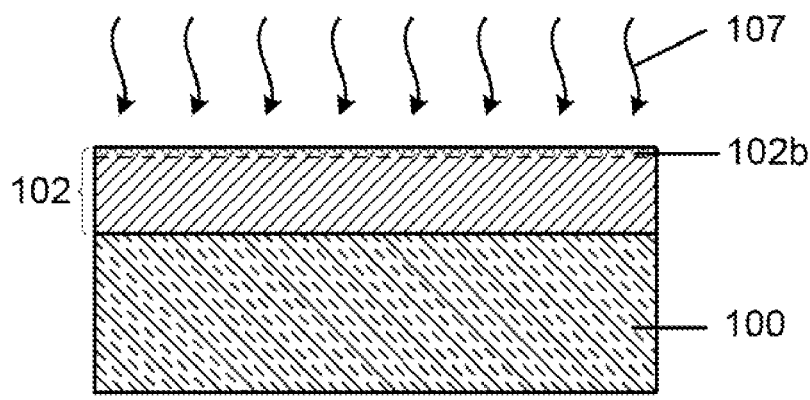
Figure 1D:
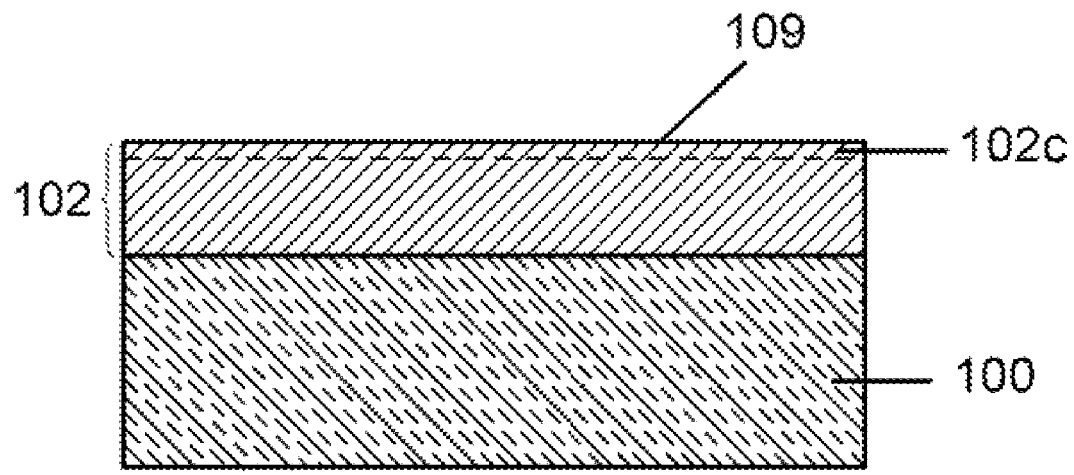

Referring now to FIG. 1C, following activation of the oxidized surface layer 102a for chemical reduction, a second process gas 107 containing $H_2$ gas is flowed into the plasma processing chamber (or an alternate processing chamber) and a second gas pressure is selected in the plasma processing chamber. According to one embodiment, the second gas pressure may be greater than the first gas pressure. The activated oxidized surface layer 102b is exposed to the second process gas 107 containing non-plasma-excited hydrogen ($H_2$) gas for a desired period of time to chemically reduce the activated oxidized surface layer 102b. According to embodiments of the invention, the exposure to the first process gas, in addition to activating the oxidized surface layer 102a, facilitates chemical reduction of the activated oxidized surface layer 102b by the second process gas 107 containing the hydrogen gas.

Figure 10:
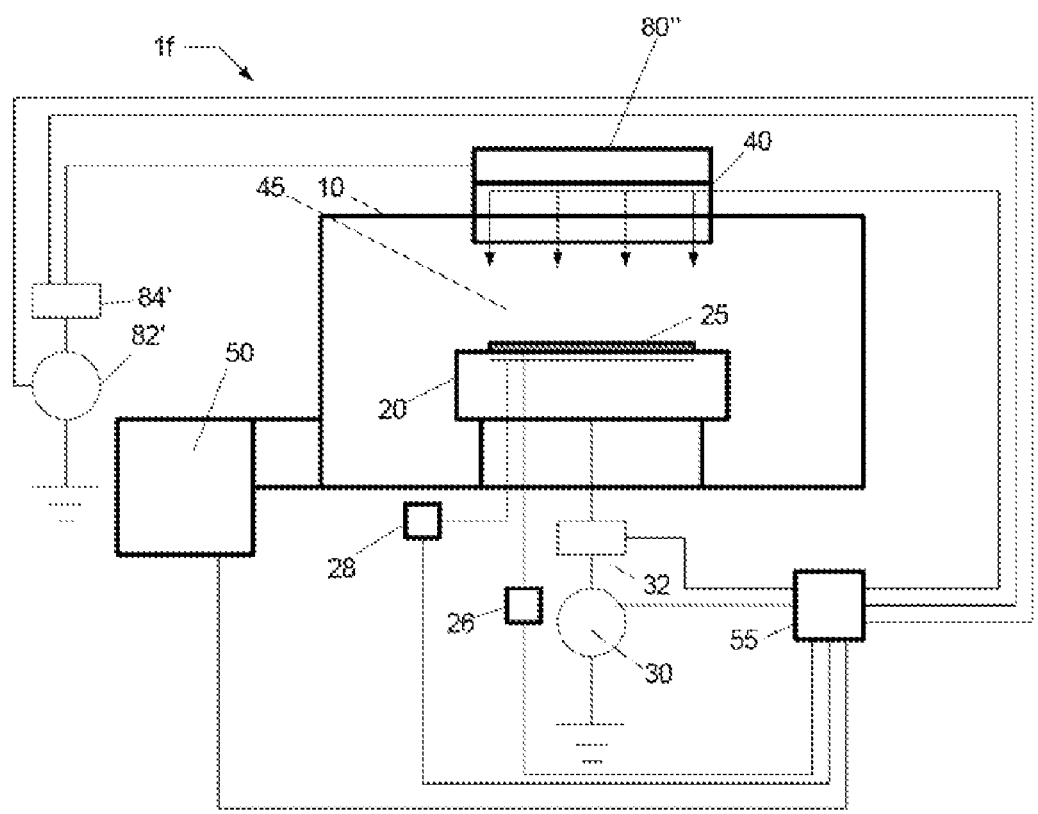

FIG. 10 shows a chemically reduced layer 102c following the chemical reduction of the activated oxidized surface layer 102b. As described above, the chemically reduced layer 102c may have a "metal-rich" (e.g., Ta-rich) surface 109 with improved bonding to other materials deposited or formed on the chemically reduced layer 102c.

Figure 1E:
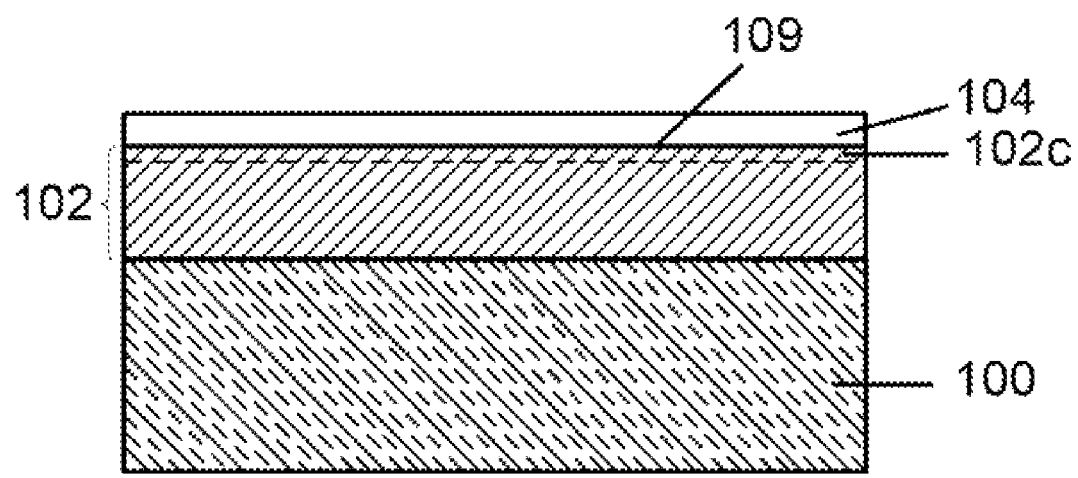

FIG. 1E shows Cu metal or metal-containing liner 104 formed on the chemically reduced layer 102c. In one example, the metal-containing liner 104 may contain a smooth Ru metal liner with strong bonding to the chemically reduced layer 102c.

Figure 2:
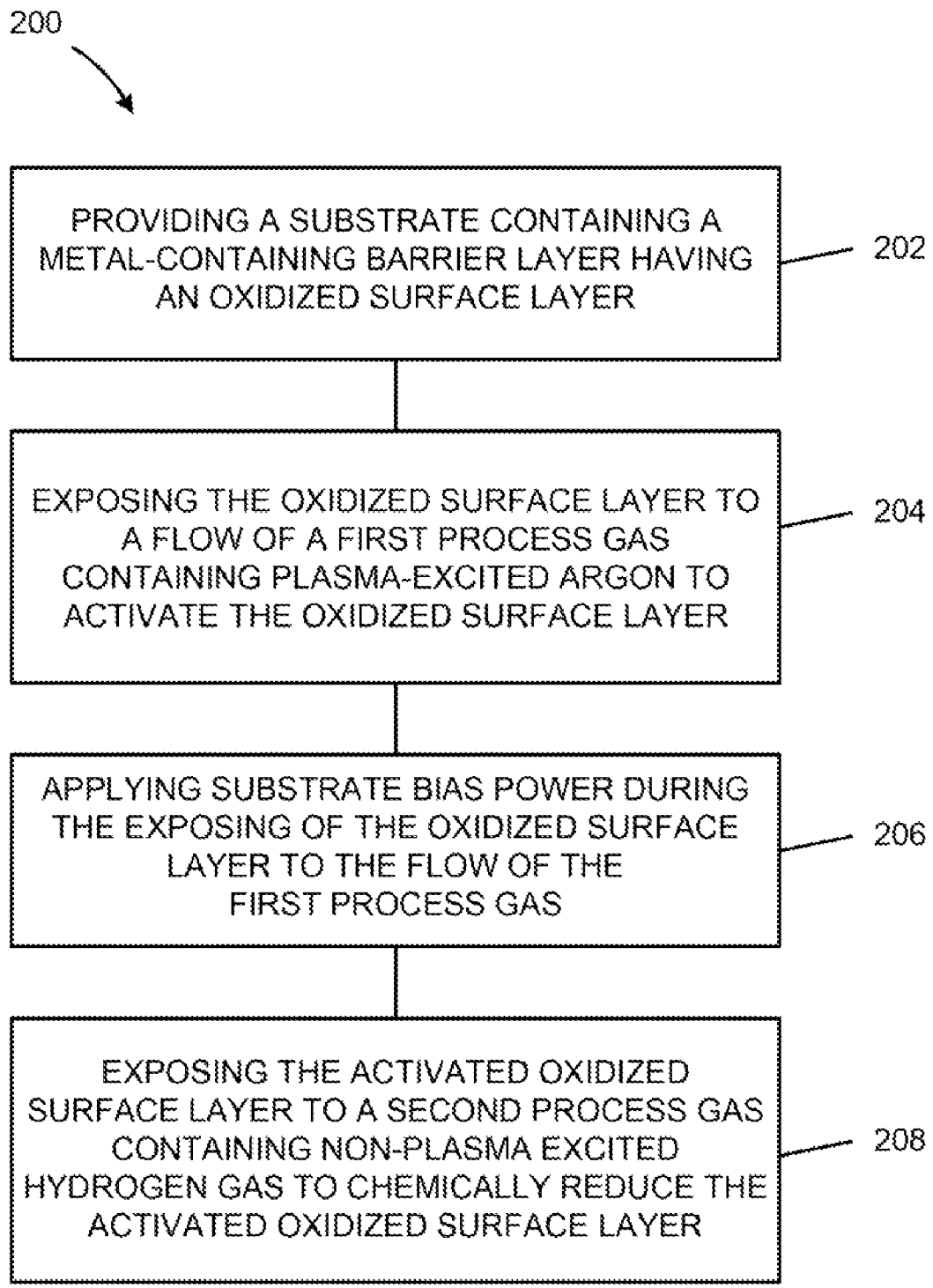
FIG. 2 shows a process flow diagram of a hybrid in-situ cleaning process in accordance with an embodiment of the invention.

FIG. 2 shows a process flow diagram of a hybrid in-situ cleaning process in accordance with an embodiment of the invention. The process flow 200 of FIG. 2 may be performed using the vacuum processing tool of FIG. 3, or any other suitable vacuum processing tool configured to process a substrate in-situ without exposing the substrate to air. In 202, a substrate is provided in the vacuum processing tool 300. According to one embodiment, the substrate contains a metal-containing barrier layer having an oxidized surface layer, where the metal-containing barrier layer is deposited in an alternate vacuum processing tool prior to introducing the substrate into the vacuum processing tool of FIG. 3. According to another embodiment, a metal-containing barrier layer may be deposited on the substrate in the vacuum processing tool 300 and a hybrid in-situ cleaning process performed on the metal-containing barrier layer without exposure to air. The vacuum processing tool 300 contains a substrate (wafer) transfer system 301 that includes cassette modules 301A and 301B, and a substrate alignment module 301C. Load-lock chambers 302A and 302B are coupled to the substrate transfer system 301 using gate valves G1 and G2, respectively. The substrate transfer system 301 is maintained at atmospheric pressure but a clean environment is provided by purging with an inert gas.

The load lock chambers 302A and 302B are coupled to a substrate transfer system 303 using gate valves G3 and G4. The substrate transfer system 303 may be maintained at a sub-atmospheric pressure using a turbomolecular pump (not shown) and optionally an inert gas may be used to continuously purge the substrate transfer system 303. The substrate transfer system 303 includes a substrate transfer robot and is coupled to degassing system 304A, plasma cleaning system 304B configured for cleaning a substrate or films prior to further processing, and auxiliary processing system 304C. The processing systems 304A, 3046, and 304C are coupled to the substrate transfer system 303 using gate valves G5, G6, and G7, respectively.

The plasma cleaning system 304B may be a plasma processing system configured to perform a hybrid dry cleaning process according to embodiments of the invention. Exemplary plasma processing systems are described in FIGS. 4-10.

In 204, a substrate containing a metal-containing barrier layer having an oxidized surface layer is exposed to a flow of a first process gas containing plasma-excited argon gas at a first gas pressure in the plasma cleaning system 3046 to activate the oxidized surface layer and, in 206, a substrate bias power is applied to a substrate holder supporting the substrate during the exposing of the oxidized surface layer to the flow of the first process gas. The substrate bias power applied to the substrate holder is below a threshold bias level that results in sputtering of metal species from the oxidized surface layer. According to embodiments of the invention, the substrate bias power is greater than 0 Watts (W), for example greater than 0 W and less than about 200 W. According to some embodiments, the substrate bias power can be between about 50 W and about 150 W, for example about 100 W, for Ta-containing barrier layers (e.g., TaN). However, different substrate bias power levels may be used for different types of metal-containing barrier layers. Exemplary first gas pressure can be less than 1 Torr, between about 0.5 mTorr and about 500 mTorr, between about 20 mTorr and about 200 mTorr, or between about 50 mTorr and about 200 mTorr. According to some embodiments the first gas pressure can be about 0.5 mTorr, or lower. Exemplary exposure times to the first process gas can about or greater than 10 seconds, for example between about 10 seconds and about 60 seconds, between about 10 seconds and about 30 seconds, or between about 10 seconds and about 20 seconds. However, embodiments of the invention are not limited by these substrate bias power levels, first gas pressures, or exposure times, as other process conditions may be utilized.

In 208, the activated oxidized surface layer is exposed to a second process gas containing non-plasma-excited hydrogen gas at a second gas pressure to chemically reduce the activated oxidized surface layer. According to one embodiment, the second gas pressure may be greater than the first gas pressure. According to one embodiment of the invention, the exposure to the second process gas may be performed in the plasma cleaning system 304B without generating a plasma. According to another embodiment, the exposure to the second process gas may be performed in an alternate processing system, for example in auxiliary processing system 304C, in a processing system configured for depositing Cu metal onto the metal-containing barrier layer, or in a processing system configured for depositing a metal-containing liner onto the metal-containing barrier layer.

According to embodiments of the invention, the second process gas can include pure $H_2$, or a combination of $H_2$ and an inert gas. The inert gas may be selected from $N_2$ and noble gases (i.e., He, Ne, Ar, Kr, and Xe). Combinations of $H_2$ and an inert gas can, for example, include 90% $H_2$ or less, for example 80%, 60%, 20%, 10%, 5%, or less, and balance inert gas. Exemplary process conditions further include a second gas pressure greater than 1 Torr, for example between greater than 1 Torr and about 1000 Torr, between greater than 1 Torr and about 100 Torr, or between greater than 1 Torr and about 5 Torr, for example between 1.5 Torr and 3 Torr. The utilization of a second gas pressure that is greater than the first gas pressure enables enhanced chemical reduction of the activated oxidized surface layer using short processing times. Exemplary exposure times to the second process, gas can about or greater than 10 seconds, for example between about 10 seconds and about 10 minutes, between about 10 seconds and about 5 minutes, or between about 10 seconds and about 60 seconds. However, embodiments of the invention are not limited by these second process gas compositions, second gas pressures, or exposure times, as other process conditions may be utilized.

The substrate transfer system 303 is coupled to a substrate transfer system 305 through substrate handling chamber 304D and gate valve G8. As in the substrate transfer system 303, the substrate transfer system 305 may be maintained at a sub-atmospheric pressure using a turbomolecular pump (not shown) and optionally an inert gas may be used to continuously purge the substrate transfer system 305. The substrate transfer system 305 includes a substrate transfer robot. Processing system 306A is coupled to the substrate transfer system 305 and may be configured for depositing a barrier layer on a substrate. According to one embodiment of the invention, the processing system 306A may be an ionized physical vapor deposition (IPVD) system. An exemplary IPVD system is described in U.S. Pat. No. 6,287,435. According to another embodiment, the processing system 306A may be a plasma enhanced atomic layer deposition (PEALD) system configured for using a source gas and a reducing gas that are alternately exposed to the substrate with purge/evacuation steps between the alternating exposures. Source gases that may be utilized for depositing Ta-containing layers such as TaN, TaCN, and TaC, can include metal organic compounds such as tertiaryamylimidotris(dimethylamido)tantalum (Ta(NC$(CH_3)_2C_2H_5)(N(CH_3)_2)_3$, TAIMATA), pentakis(diethylamido) tantalum (Ta(N($C_2H_5)_2)_5$, PDEAT), pentakis(ethylmethylamido) tantalum (Ta(N($C_2H_5)CH_3)_5$, PEMAT), pentakis(dimethylamido) tantalum (Ta(N($CH_3)_2)_5$, PDMAT), t-butylimino tris(diethylamido) tantalum (Ta(NC$(CH_3)_3)(N(C_2H_5)_2)_3$, TBTDET), Ta(N$C_2H_5)(N(C_2H_5)_2)_3$, Ta(NC($CH_3)_3)(N(CH_3)_2)_3$, tert-butyl-tris-ethylmethylamido tantalum (Ta(NC($CH_3)_3)((NC_2H_5(CH_3)_3)_3)$, TBTEMAT), Ta(NC($CH_3)_2)_3$, or Ta(N$C_2H_5)_2)_3$. Source gases that may be utilized for depositing a Ta layers can include $TaF_5$, $TaBr_5$, $TaI_5$. Exemplary PEALD systems are described in U.S. Pat. No. 7,314,835.

Processing system 306D may be an IPVD system configured for depositing a Cu seed layer, or alternately a chemical vapor deposition (CVD) system for depositing a Cu seed layer. Processing system 306C may be a CVD system configured for depositing a metal-containing liner (e.g., Ru, Co, or compounds thereof) on a barrier layer. Exemplary CVD systems are described in U.S. Pat. Nos. 7,270,848 and 7,279,421. A Ru CVD system may utilize a process gas containing $Ru_3(CO)_{12}$ and CO.

The processing systems 306A, 306B, 306C, and 306D are coupled to the vacuum substrate transfer system 305 using gate valves G9, G10, G11, and G12, respectively.

Figure 3:
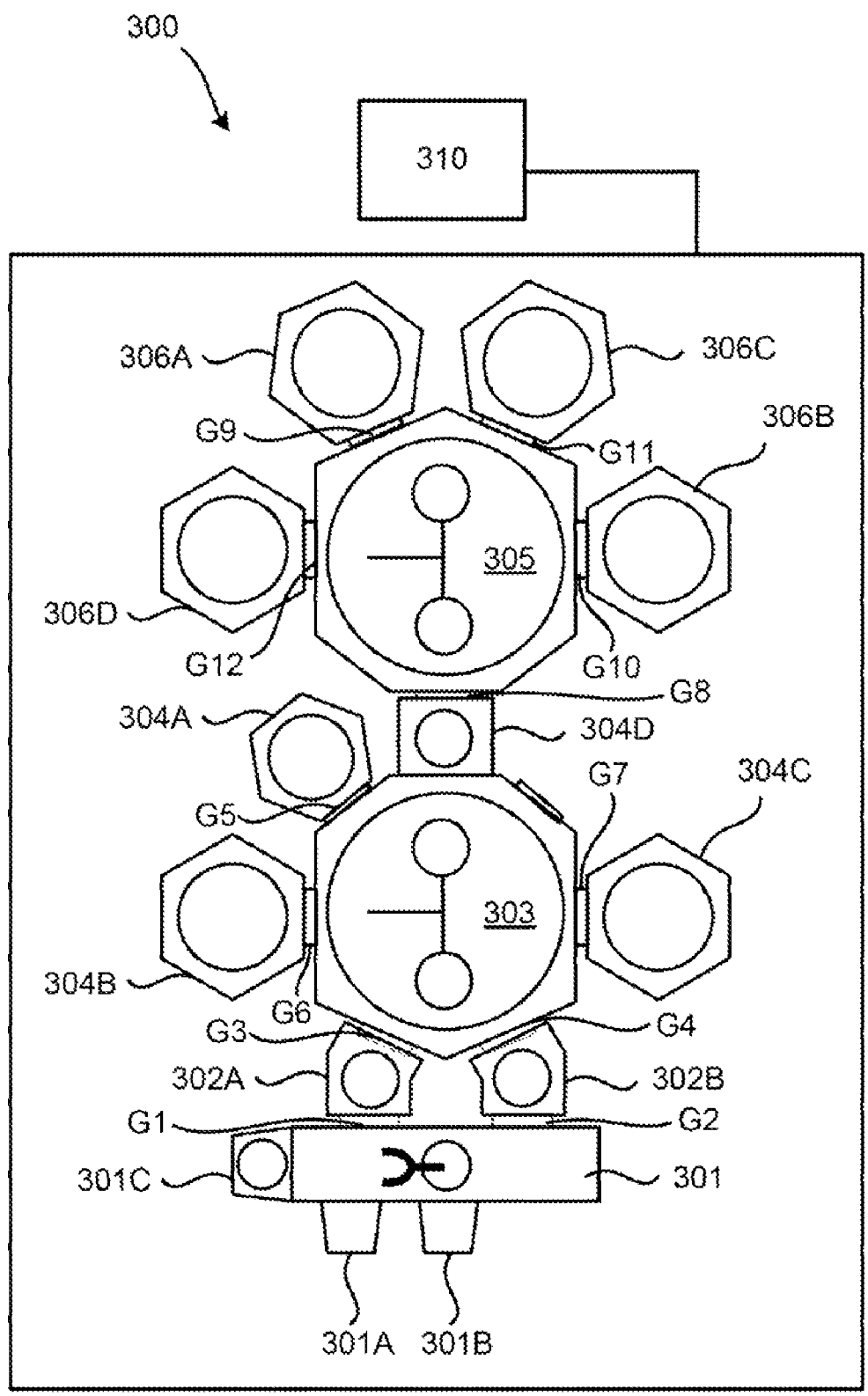
FIG. 3 is a schematic diagram of a vacuum processing tool according to an embodiment of the invention.

The vacuum processing tool 300 includes a controller 310 that can be coupled to and control any or all of the processing systems and processing elements depicted in FIG. 3 during the integrated substrate processing. Alternatively, or in addition, controller 310 can be coupled to one or more additional controllers/computers (not shown), and controller 310 can obtain setup and/or configuration information from an additional controller/computer. The controller 310 can be used to configure any or all of the processing systems and processing elements, and the controller 310 can collect, provide, process, store, and display data from any or all of the processing systems and processing elements. The controller 310 can comprise a number of applications for controlling any or all of the processing systems and processing elements. For example, controller 310 can include a graphic user interface (GUI) component (not shown) that can provide easy to use interfaces that enable a user to monitor and/or control one or more processing systems and processing elements.

The controller 310 can include a microprocessor, memory, and a digital I/O port capable of generating control voltages sufficient to communicate, activate inputs, and exchange information with the vacuum processing tool 300 as well as monitor outputs from the vacuum processing tool 300. For example, a program stored in the memory may be utilized to activate the inputs of the vacuum processing tool 300 according to a process recipe in order to perform integrated substrate processing. One example of the controller 310 is a DELL PRECISION WORKSTATION 610™, available from Dell Corporation, Austin, Tex.

However, the controller 310 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 310 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 310, for driving a device or devices for implementing the invention, and/or for enabling the controller 310 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 310 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 310.

The controller 310 may be locally located relative to the vacuum processing tool 300, or it may be remotely located relative to the vacuum processing tool 300. For example, the controller 310 may exchange data with the vacuum processing tool 300 using at least one of a direct connection, an intranet, the Internet and a wireless connection. The controller 310 may be coupled to an intranet at, for example, a customer site (i.e., a device maker, etc.), or it may be coupled to an intranet at, for example, a vendor site (i.e., an equipment manufacturer). Additionally, for example, the controller 310 may be coupled to the Internet. Furthermore, another computer (i.e., controller, server, etc.) may access, for example, the controller 310 to exchange data via at least one of a direct connection, an intranet, and the Internet. As also would be appreciated by those skilled in the art, the controller 310 may exchange data with the vacuum processing tool 300 via a wireless connection. As those skilled in the art will readily recognize, embodiments of the invention may not require the use of all the processing systems of the vacuum processing tool 300 depicted in FIG. 3. For example, according to one embodiment, a barrier layer may be deposited on a substrate prior to introducing the substrate into the vacuum processing tool 300 and thus processing system 306A may not be required for barrier layer deposition. Thus, some embodiments of the invention may include the use of less than all the processing systems depicted in FIG. 3.

Figure 4:
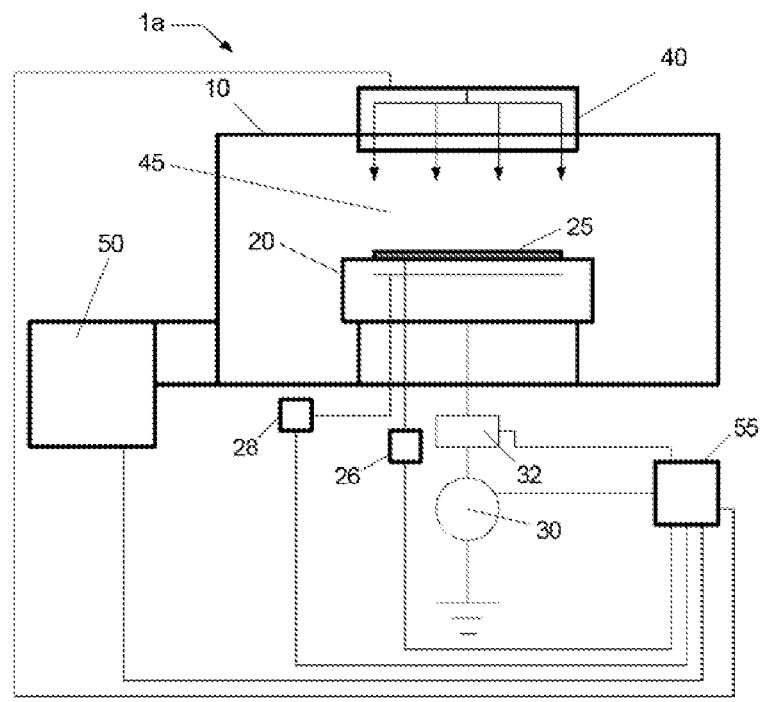
FIG. 4-10 are schematic diagrams of plasma processing systems according to embodiments of the invention.

FIGS. 4-10 schematically show plasma processing systems that may be configured for performing at least a portion of a hybrid in-situ dry cleaning process according to embodiments of the invention. Referring now to FIG. 4, according to one embodiment, a plasma processing system 1a configured to perform the above identified process conditions for a hybrid in-situ dry cleaning process and comprises a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas delivery system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 4, substrate holder 20 can comprise an electrode through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a plasma assisted process on substrate 25.

Controller 55 can be locally located relative to the plasma processing system 1a, or it can be remotely located relative to the plasma processing system 1a. For example, controller 55 can exchange data with plasma processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 5, plasma processing system 1b can be similar to the embodiment of FIG. 4 and further comprise either a stationary, or mechanically or electrically rotating magnetic field system 60, in order to potentially increase plasma density and/or improve plasma processing uniformity, in addition to those components described with reference to FIG. 4. Moreover, controller 55 can be coupled to magnetic field system 60 in order to regulate the speed of rotation and field strength. The design and implementation of a rotating magnetic field is well known to those skilled in the art.

Figure 5:
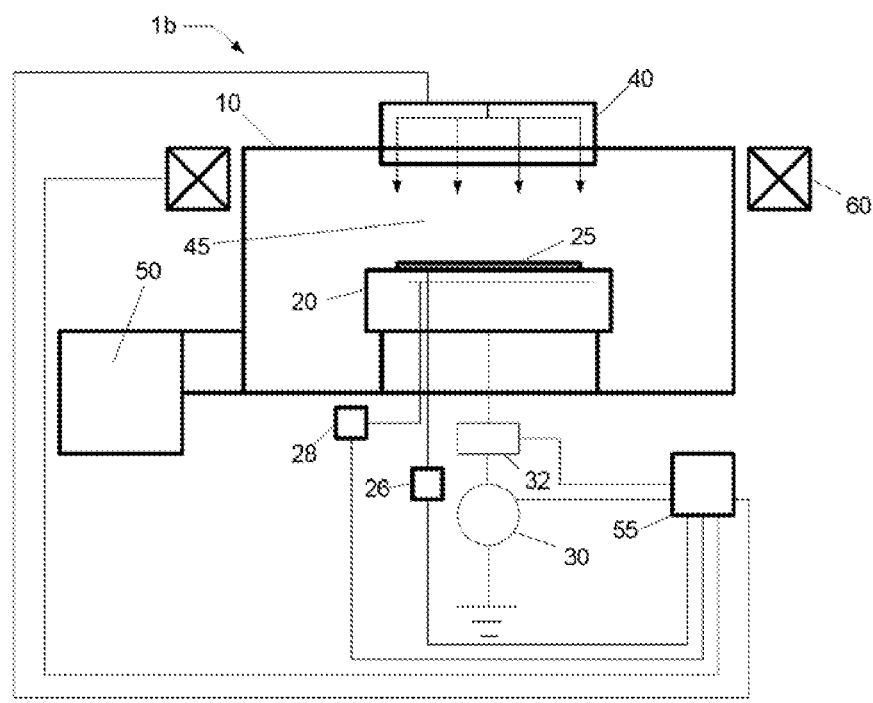
Figure 6:
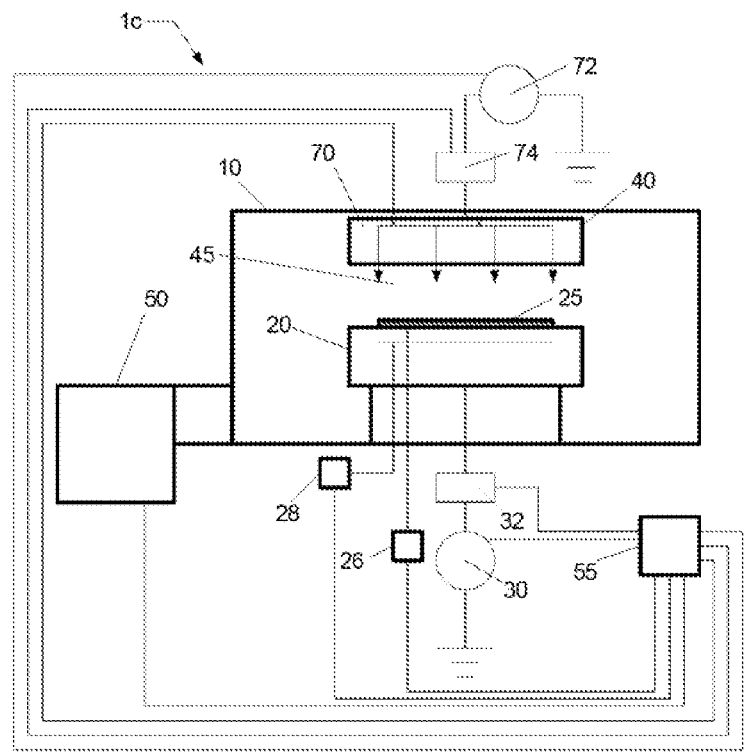

In the embodiment shown in FIG. 6, plasma processing system 1c can be similar to the embodiment of FIG. 4 or FIG. 5, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 7:
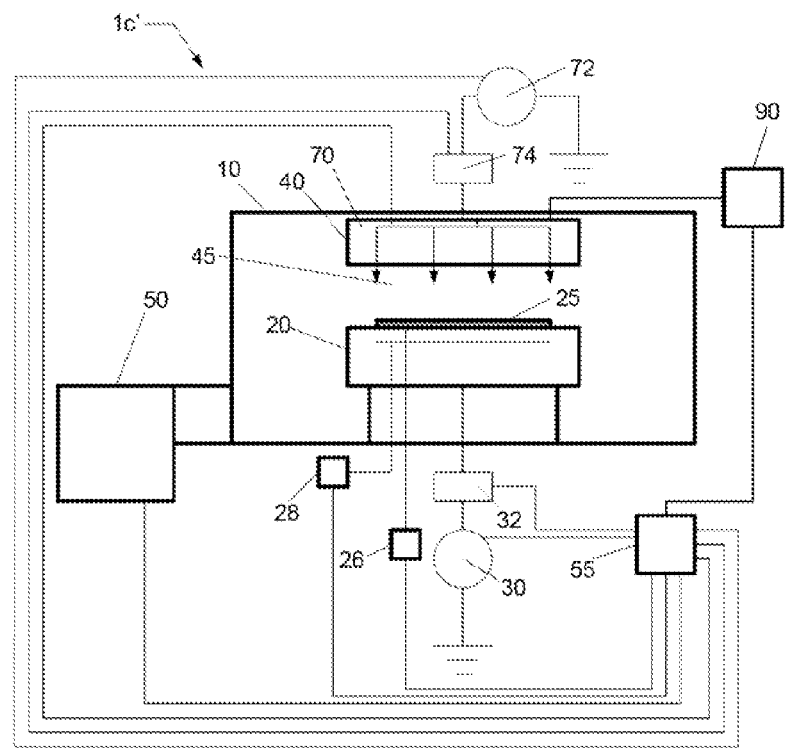

In the embodiment shown in FIG. 7, plasma processing system 1c' can be similar to the embodiment of FIG. 6, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring adjusting, or controlling the polarity, current, voltage, or on/off state of the DC power supply 90. Once plasma is formed, the DC power supply 90 facilitates the formation of a ballistic electron beam. An electrical filter may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias power generated on a surface of the upper electrode 70. The surface of the upper electrode 70 facing the substrate holder 20 may be comprised of a silicon-containing material.

Figure 8:
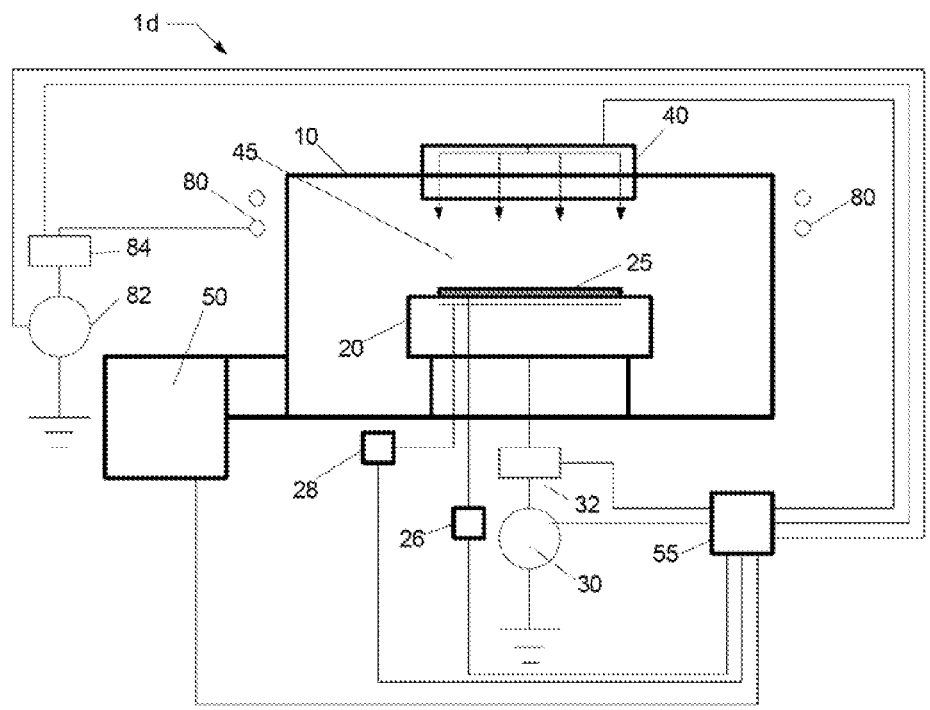

In the embodiment shown in FIG. 8, plasma processing system 1d can be similar to the embodiments of FIGS. 3 and 4, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 9:
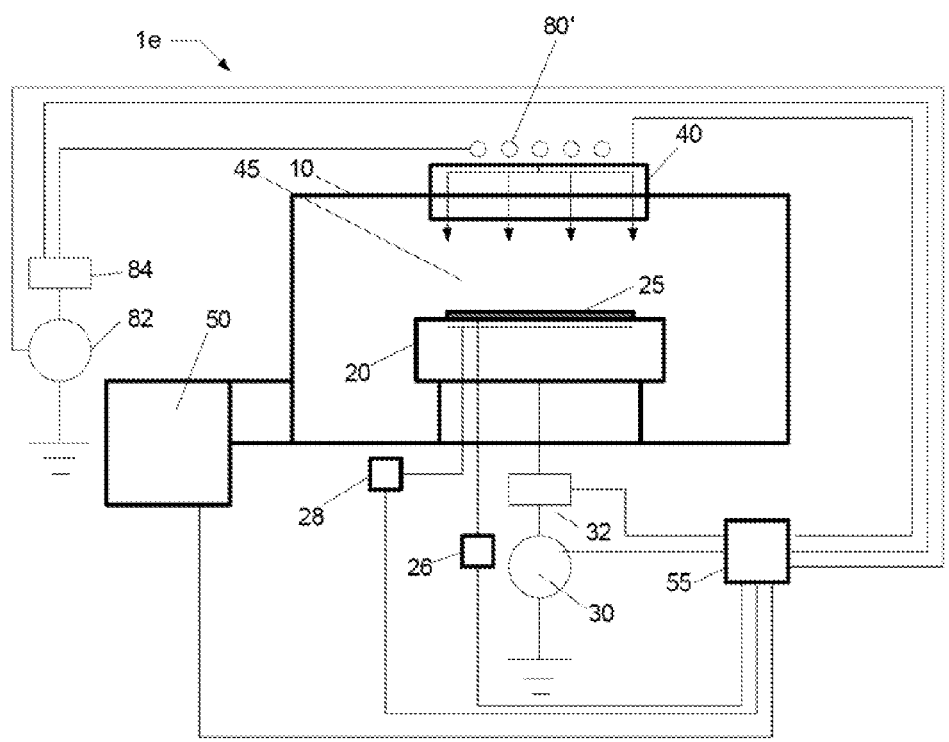

In an alternate embodiment, as shown in FIG. 9, plasma processing system 1e can be similar to the embodiment of FIG. 8, and can comprise an inductive coil 80' that is a "spiral" coil or "pancake" coil in communication with the plasma processing region 45 from above as in a transformer coupled plasma (TCP) reactor. The design and implementation of inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the embodiment shown in FIG. 10, plasma processing system if can be similar to the embodiments of FIGS. 4 and 5, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

FIGS. 11A and 11B present process data for dry cleaning of oxidized surface layers according to an embodiment of the invention. The dry cleaning utilized an ICP source, where the substrate bias power can be independently controlled relative to the power applied for generating a plasma. The test structures contained silicon substrates with TaN barrier layers having a thickness of 4-10 nm deposited thereon. The TaN barrier layers were deposited by IPVD using Ta sputtering targets and $N_2$ gas, and thereafter the TaN barrier layers exposed to air for a time period of at least 1 day to oxidize a surface layer of the TaN barrier layer. Thereafter the sheet resistivity of the films was measured before and after different dry cleaning processes. FIG. 11A shows changes in sheet resistivity (ohms/sq.) for different process recipes and FIG. 11B shows calculated film resistivity ($\mu$ohm-cm) for the same samples. The process recipes included treating the oxidized TaN barrier layers with an Ar plasma exposure using an ICP source with a gas pressure of 0.5 mTorr and low or zero substrate bias power (soft Ar cleaning), with a subsequent anneal in the presence of a $H_2$-containing gas, or both soft Ar cleaning and a subsequent anneal in non-overlapping steps. The process recipes included: 1) soft Ar cleaning for 15 seconds at a bias power of 100 W, 2) $H_2$ anneal for 15 seconds at a gas pressure of 3 Torr, followed by soft Ar cleaning for 15 seconds at a bias power of 100 W; 3) soft Ar cleaning for 15 seconds at a substrate bias power of 0 W, 4) $H_2$ anneal for 15 seconds at a gas pressure of 3 Torr, followed by soft Ar cleaning for 15 seconds at a substrate bias power of 0 W; 5) $H_2$ anneal for 15 seconds at a gas pressure of 3 Torr, followed by soft Ar cleaning for 15 seconds at a substrate bias power of 100 W; and 6) soft Ar cleaning for 15 seconds at a substrate bias power of 0 W, followed by $H_2$ anneal for 15 seconds at a gas pressure of 3 Torr. Further, the substrate temperature was estimated to be less than 100° C. during soft Ar cleaning (substrate clamped to a substrate holder (chuck) having a temperature of approximately 25° C.), and the substrate temperature was estimated to be between 150° C.-200° C. during the H2 anneal (substrate unclamped on a substrate holder having a temperature of approximately 250° C.-260° C.

The process data shows that soft Ar cleaning without a subsequent $H_2$ annealing (Process recipes 1 and 3), increased the sheet resistivity and the film resistivity. Furthermore, $H_2$ annealing with subsequent soft Ar cleaning (Process recipes 2 and 4), also increased the sheet resistivity and the film resistivity. Still further, Process recipe 6, soft Ar cleaning using a bias of 0 W, with subsequent $H_2$ annealing, increased the sheet resistivity and the film resistivity. However, Process recipe 5, soft Ar cleaning using a non-zero bias of 100 W, with subsequent $H_2$ annealing, decreased the sheet resistivity and the film resistivity. Measurements of the thicknesses of the TaN barrier layers showed little or no thickness changes as a result of the processing described above. The thickness differences were within error of measurement—0.5 Å or less change in thickness.

The decrease in sheet resistivity and the film resistivity demonstrates chemical reduction of the oxidized surface layer when using Process recipe 5. It is contemplated that the first step of soft Ar cleaning activates the oxidized surface layer of the TaN barrier layer, by breaking or weakening of some Ta—O chemical bonds, and the second step of exposing the activated oxidized surface layer to the $H_2$ gas facilitates chemical reduction of the activated surface layer. The process data further shows that as little as 15 seconds of Ar plasma exposure and 15 seconds of $H_2$ exposure at a gas pressure of 3 Torr are effective in cleaning the TaN barrier layer. The low substrate bias power is thought to result in very low surface damage of the TaN barrier layer and the underlying substrate.

The process data further shows that the order of the process steps is important, i.e., soft Ar plasma step followed by $H_2$ anneal is effective in chemically reducing the oxidized surface layer. For comparison, $H_2$ anneal followed by a soft Ar plasma did not result in chemical reduction of the oxidized surface layer.

FIG. 12A schematically shows a cross-sectional view of a dual damascene interconnect structure. Dual damascene interconnect structures are well known by one of ordinary skill in the art of integrated circuit fabrication. The dual damascene interconnect structure depicted in FIG. 12A contains a dual damascene interconnect recessed feature 524 formed over a conductive interconnect structure 522 and a barrier layer 530 formed over surfaces of the recessed feature 524. The dual damascene interconnect recessed feature 524 contains a via 528 having sidewall and bottom surfaces 528a and 528b, respectively, and a trench 526 formed in dielectric film 518, where the trench 526 contains sidewall and bottom surfaces 526a and 526b, respectively. The trench 526 may be used for an upper conductive interconnect structure and the via 528 connects the trench 526 to the conductive interconnect structure 522. The interconnect structure further contains dielectric layers 512 and 514, barrier film 520 surrounding the conductive interconnect structure 522, and etch stop layer 516.

FIG. 12B schematically shows a cross-sectional view of a patterned structure according to another embodiment of the invention. The patterned structure contains a recessed feature 505a formed in a dielectric film 502 and a conductive layer 503a formed on a gate electrode 506 at the bottom of the recessed feature 505a. The gate electrode 506 is part of a gate structure that further contains a gate dielectric film 507. The gate dielectric film 507 can contain $SiO_2$, $SiO_xN_y$, $SiN_y$, or a high dielectric constant (high-k) material having a dielectric constant greater than that of $SiO_2$ (k~3.9), or a combination thereof. High-k materials can include metal oxides, metal oxynitrides, and their silicates, for example $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or BaO, or combinations of two or more thereof.

Furthermore, the patterned structure in FIG. 12B contains a recessed feature 505b formed in the dielectric film 502 and a conductive layer 503b formed on a doped substrate region 501 (e.g., a drain or a source region) in the substrate 500 at the bottom of the recessed feature 505b. The substrate 500 can, for example, be a 200 mm Si wafer, a 300 mm Si wafer, or an even larger Si wafer. The dielectric film 502 can contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, and/or halogens, either as dense or porous materials. According to an embodiment of the invention, the recessed features 505a, 505b can be vias with aspect ratios (depth/width) greater than or equal to about 2, for example 3, 4, 5, 6, 7, 12, 15, or higher. The vias can have widths of about 200 nm or less, for example 150 nm, 100 nm, 65 nm, 45 nm, 32 nm, 20 nm, or lower. In one example, the recessed features 505a, 505b can be 45 nm wide vias with aspect ratios of about 7. However, embodiments of the invention are not limited to these aspect ratios or via widths, as other aspect ratios or via widths may be utilized. The conductive layers 503a and 503b can include silicide contact layers that provide thin stable electrical contacts and can, for example, contain $CoSi_2$, PtSi, $Pd_2Si$, $TiSi_2$, $WSi_2$, $NiSi_2$, or $TaSi_2$, or a combination of two or more thereof. One combination may contain PtNiSi that allows the use of higher processing temperatures than $NiSi_2$. The patterned structure in FIG. 12B further contains a barrier layer 508 formed over the surfaces of the recessed features 505a and 505b. Processing methods for forming the patterned structures depicted in FIGS. 12A and 12B are well known to one skilled in the art.

A plurality of embodiments for a hybrid in-situ dry cleaning process for oxidized surface layers has been disclosed in various embodiments. The oxidized surface layers can include surfaces of metal-containing barrier layers found in integrated circuits. However, embodiments of the invention may be applied to other types of layers found in semiconductor manufacturing that require in-situ cleaning prior to further processing, for example metal layers, dielectric layers, and semiconductor layers. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the patterned substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

The invention claimed is:

1. A hybrid in-situ dry cleaning method, comprising:
providing a substrate containing a metal-containing barrier layer, wherein the metal-containing barrier layer contains an oxidized surface layer;
exposing the oxidized surface layer to a flow of a first process gas containing plasma-excited argon gas to activate the oxidized surface layer;
applying substrate bias power during the exposing of the oxidized surface layer to the flow of the first process gas; and
exposing the activated oxidized surface layer to a second process gas containing non-plasma-excited hydrogen gas and not the first process gas containing the plasma-excited argon gas, wherein the exposure to the first process gas, in addition to activating the oxidized surface layer, facilitates chemical reduction of the activated oxidized surface layer by the second process gas containing the hydrogen gas, wherein a thickness of the metal-containing barrier layer is not substantially changed by the exposing and applying steps.

2. The method of claim 1, wherein the applying the substrate bias power comprises applying a substrate bias power greater than 0 W.

3. The method of claim 1, wherein the applying a substrate bias power comprises applying a substrate bias power between about 50 W and about 150 W.

4. The method of claim 1, wherein the substrate bias power is below a threshold bias level that results in sputtering of metal species from the metal-containing barrier layer by the plasma-excited argon gas.

5. The method of claim 1, further comprising:
exposing the oxidized surface layer to the flow of the first process gas at a first gas pressure; and
exposing the activated oxidized surface layer to the flow of the second process gas at a second gas pressure that is greater than the first gas pressure.

6. The method of claim 5, wherein the second gas pressure is greater than 1 Torr.

7. The method of claim 1, wherein the metal-containing barrier layer comprises a Ta-containing barrier layer, a Ti-containing barrier layer, a W-containing barrier layer, or a combination of two or more thereof.

8. The method of claim 1, wherein the plasma-excited argon gas is generated in an inductively coupled plasma processing system.

9. A method of processing a substrate, comprising:
providing the substrate in a vacuum processing tool;
depositing a metal-containing barrier layer on the substrate in the vacuum processing tool;
performing a hybrid in-situ dry cleaning of an oxidized surface layer on the metal-containing barrier layer by:
exposing the oxidized surface layer to a flow of a first process gas containing plasma-excited argon gas to activate the oxidized surface layer;
applying substrate bias power during the exposing of the oxidized surface layer to the flow of the first process gas; and
exposing the activated oxidized surface layer to a second process gas containing non-plasma-excited hydrogen gas and not the first process gas containing the plasma-excited argon gas, wherein the exposure to the first process gas, in addition to activating the oxidized surface layer, facilitates chemical reduction of the activated oxidized surface layer by the second process gas containing the hydrogen gas, wherein a thickness of the metal-containing barrier layer is not substantially changed by the exposing and applying steps; and
following the performing, depositing a metal-containing film on the metal-containing barrier layer, wherein the hybrid in-situ dry cleaning and the depositing the metal-containing film on the metal-containing barrier layer are carried out without exposing the metal-containing barrier layer to air.

10. The method of claim 9, wherein the applying the substrate bias power comprises applying a substrate bias power greater than 0 W.

11. The method of claim 9, wherein the applying a substrate bias power comprises applying a substrate bias power between about 50 W and about 150 W.

12. The method of claim 9, wherein the substrate bias power is below a threshold bias level that results in sputtering of metal species from the metal-containing barrier layer by the plasma-excited argon gas.

13. The method of claim 9, further comprising:
exposing the oxidized surface layer to the flow of the first process gas at a first gas pressure; and
exposing the activated oxidized surface layer to the flow of the second process gas at a second gas pressure that is greater than the first gas pressure.

14. The method of claim 13, wherein the second gas pressure is greater than 1 Torr.

15. A method of processing a substrate, comprising:
providing the substrate in a first vacuum processing tool;
depositing a metal-containing barrier layer on the substrate in the first vacuum processing tool;
transferring in air the substrate containing the metal-containing barrier layer from the first vacuum processing tool to a second vacuum processing tool;
performing a hybrid in-situ dry cleaning of an oxidized surface layer of the metal-containing barrier layer in the second vacuum processing tool by:
exposing the oxidized surface layer to a flow of a first process gas containing plasma-excited argon gas to activate the oxidized surface layer;
applying substrate bias power during the exposing of the oxidized surface layer to the flow of the first process gas; and
exposing the activated oxidized surface layer to a second process gas containing non-plasma-excited hydrogen gas and not the first process gas containing the plasma-excited argon gas, wherein the exposure to the first process gas, in addition to activating the oxidized surface layer, facilitates chemical reduction of the activated oxidized surface layer by the second process gas containing the hydrogen gas, wherein a thickness of the metal-containing barrier layer is not substantially changed by the exposing and applying steps; and
following the performing, depositing a metal-containing film on the metal-containing barrier layer in the second vacuum processing tool, wherein the hybrid in-situ dry cleaning and the depositing the metal-containing film on the metal-containing barrier layer are carried out without exposing the metal-containing barrier layer to air.

16. The method of claim 15, wherein the applying the substrate bias power comprises applying a substrate bias power greater than 0 W.

17. The method of claim 15, wherein the applying a substrate bias power comprises applying a substrate bias power between about 50 W and about 150 W.

18. The method of claim 15, wherein the substrate bias power is below a threshold bias level that results in sputtering of metal species from the metal-containing barrier layer by the plasma-excited argon gas.

19. The method of claim 15, wherein the second gas pressure is greater than 1 Torr.

20. The method of claim 15, further comprising:
exposing the oxidized surface layer to the flow of the first process gas at a first gas pressure; and
exposing the activated oxidized surface layer to the flow of the second process gas at a second gas pressure that is greater than the first gas pressure.

* * * * *